United States Patent [19]

Levine

[11] Patent Number: 4,661,788
[45] Date of Patent: Apr. 28, 1987

[54] TAPPED CCD DELAY LINE WITH NON-DESTRUCTIVE CHARGE SENSING USING FLOATING DIFFUSIONS

[75] Inventor: Peter A. Levine, Mercer County, N.J.

[73] Assignee: RCA Corporation, Princeton, N.J.

[21] Appl. No.: 732,607

[22] Filed: May 10, 1985

[51] Int. Cl.$^4$ ............................................. H03H 15/00
[52] U.S. Cl. .................................... 333/165; 333/166; 377/60
[58] Field of Search .................. 333/165, 166; 329/50, 329/102, 109; 377/57, 60, 63

[56] References Cited

U.S. PATENT DOCUMENTS

| | | | |
|---|---|---|---|
| 4,330,753 | 5/1982 | Davy | 329/50 |
| 4,513,260 | 4/1985 | Ragan | 333/174 X |
| 4,556,851 | 12/1985 | Levine | 329/50 |

Primary Examiner—Paul Gensler
Attorney, Agent, or Firm—Eugene M. Whitacre; Allen LeRoy Limberg; James B. Hayes

[57] ABSTRACT

A CCD delay line may be tapped using a floating-diffusion electrometer at the tap. Charge sensing is made non-destructive by not resetting the floating diffusion to a reset drain after charge sensing. The resulting charge integration on the floating diffusion causes a smearing of the samples described by successive charge packets. The smearing is in the baseband frequencies of the sample frequency spectrum, but does not appreciably affect the subspectra surrounding harmonics of the delay line clock rate. Consequently, smear-free response to the floating-gate electrometer output signals can be obtained by synchronously detecting them at a harmonic of the delay line clock rate. Using floating-diffusion electrometers, rather than floating-gate electrometers, to sense charge packet amplitudes at taps along a CCD delay line lowers the noise in the output response of output-weighted, charge-coupled-device transversal fiters. Additionally, it simplifies the filter by eliminating the need for reset transistors and the bussing associated with them.

8 Claims, 5 Drawing Figures

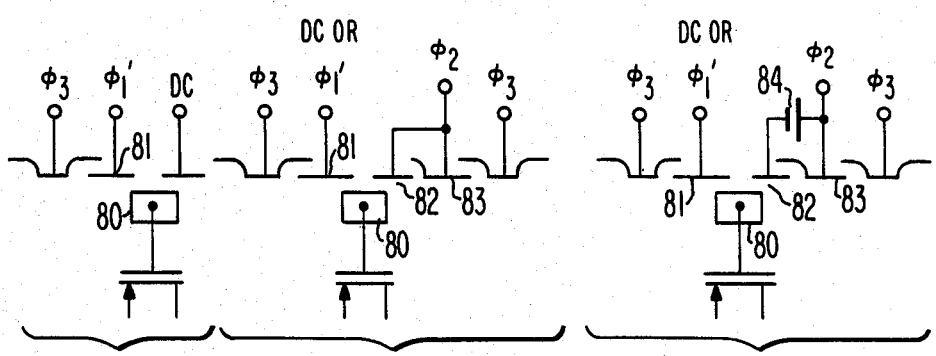

though this is a 
TAPPED CCD DELAY LINE WITH NON-DESTRUCTIVE CHARGE SENSING USING FLOATING DIFFUSIONS The invention relates to charge-coupled-device (CCD) delay lines having taps along their lengths, useful in transversal filtering for example.

BACKGROUND OF THE INVENTION

CCD transversal filters of the output-weighted type use a tapped CCD delay line to provide differentially delayed responses to a succession of input signal samples, which are then linearly combined. Linear combining comprises the weighting of the responses and the additive or subtractive combining of them. The tapped CCD delay line used in a CCD transversal filter has to use non-destructive charge sensing stages at the successive taps along its length, so that the sensed charge packets can continue to be clocked forward along the line after sensing.

The prior art method of tapping the delay line involves the use of "floating" gate electrodes in the succession of gate electrodes along the length of the CCD delay line. These floating gates connect to the gate electrodes of field effect transistors (FET's) in common-drain or common-source amplifier connection. The FET's serve as electrometers sensing the amplitudes of charge packets to provide output signal current or voltage samples. These floating gates must be periodically clamped to known potential to restore dc to the electrometer output signals. This clamping is customarily done with a respective field effect transistor for each floating gate, each of which transistors is in transmission gate connection from the floating gate electrode associated therewith to a source of reset potential. The amount of area under the gate structure comprising the floating gate, the gate electrode of the electrometer FET, and the end contact to the conduction channel of the dc-restoration clamp FET tends to be substantial. So the capacitance C of the gate structure is appreciable, and there is consequently substantial Johnson noise (dependent on $C^{(\frac{1}{2})}$) associated with the electrometer output from each CCD delay line tap.

The lowest-noise charge sensing stage available for CCD's is the floating diffusion electrometer. In this electrometer the gate electrode of the electrometer FET connects to a floating diffusion in the CCD charge transfer channel, and the clamping of the gate electrode to reference potential for dc restoration is done by FET action between the floating diffusion itself and a reset drain diffusion connected to the reference potential. The conduction channel for reset clamping is induced in the charge transfer channel by a reset pulse applied to a reset gate electrode positioned between the floating diffusion and a reset drain diffusion defining the end of the conduction channel. The gate electrode structure connected to the floating diffusion is smaller because it does not have to be ohmically contacted to a channel electrode of a clamp FET located outside the charge transfer channel. The capacitance C and thus the Johnson noise of the gate structure are appreciably reduced from what they are with the floating-gate electrometer.

L. N. Davy in his U.S. Pat. No. 4,330,753, issued May 18, 1982 and entitled "METHOD AND APPARATUS FOR A SIGNAL FROM A CHARGE TRANSFER DEVICE" describes a method for obtaining what he characterizes as relatively noise-free information signals from the output stage of a charge transfer device. In the method Davy describes, the output signal from the regularly sampling electrometer stage is passed through a band-pass filter to separate double-sideband amplitude-modulation sidebands flanking a harmonic of the clocking frequency of the electrometer stage. These side-bands are then synchronously detected, using a switching demodulator operated at the harmonic of the clocking frequency to heterodyne the sidebands down to the baseband spectrum. This synchronous detection discards response to flicker noise, or 1/f noise, in the baseband spectrum of the electrometer stage response.

The operation of a floating-diffusion electrometer at video-rate clocking frequency has been attempted without resetting the floating diffusion, but this operation was not followed with a subsequent synchronous detection process. This operation without resetting the floating diffusion or synchronously detecting the electrometer response results in a smearing of charge packets into succeeding charge packets. The smearing arises because of the inefficiency in charge transfer attending the omission of resetting the floating diffusion. The present inventor believes himself the first to realize that this smearing, while it ruins baseband spectral response in the lower frequencies particularly, does not appreciably affect spectral response in the sidebands of the electrometer stage clocking frequency. In U.S. patent application Ser. No. 525,491, filed Aug. 22, 1983, and now abandoned entitled "REDUCTION OF NOISE IN RECOVERY OF SIGNAL FROM CHARGE TRANSFER DEVICES", and assigned to RCA Corporation, the present inventor describes the floating diffusion as being reset to an in-channel potential, rather than to reset drain potential. The smear in the electrometer output is then removed by low-frequency suppression filtering, and the filter response is synchronously detected at electrometer stage clocking frequency to obtain a smear-free output signal.

SUMMARY OF THE INVENTION

In the present invention the floating diffusion in a floating-diffusion electrometer is disposed at a tap location in a CCD clocked delay line and is not frequently reset. That is, the floating diffusion is not clamped to a reset-drain potential after each admission of a charge packet under the floating diffusion. The floating-diffusion electrometer output signal is detected at a harmonic of electrometer clocking frequency to obtain a smear-free tap response from the CCD delay line. Detection may be done synchronously using a switch operative at the harmonic of electrometer clocking frequency, for example.

Multiple-tap CCD delay lines, in which each tap supplies a respective floating-diffusion electrometer and electrometer output signals are synchronously detected at a harmonic of electrometer clocking frequency, are embodiments of a further aspect of the invention. Transversal filters using such multiple-tap CCD delay lines are embodiments of still further aspects of the invention.

BRIEF DESCRIPTION OF THE DRAWING

FIGS. 3, 4 and 5 show modifications that can be made with regard to the voltages applied to gate electrodes next to the electrometer floating diffusions in the FIG. 1 and FIG. 2 filters in other embodiments of the invention.

DESCRIPTION OF THE PREFERRED EMBODIMENTS

Figure 1:
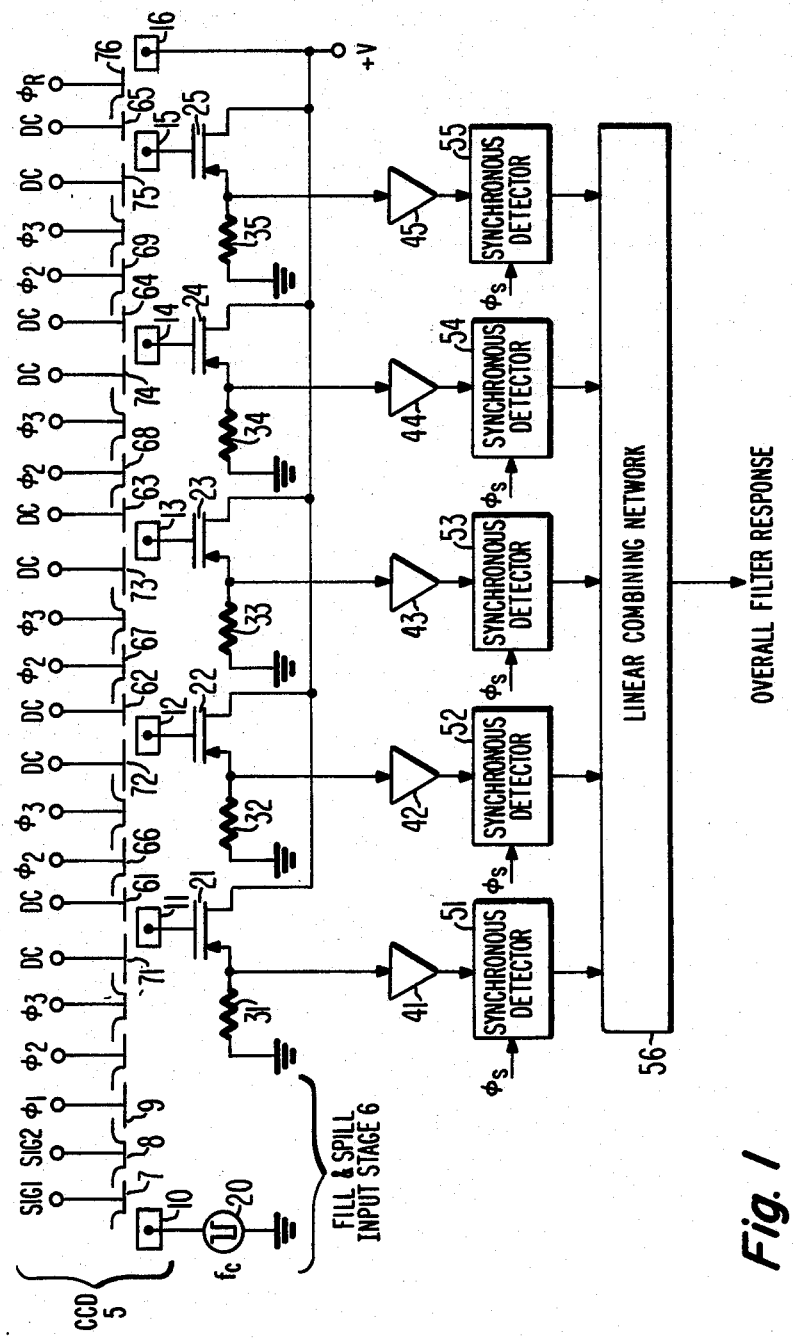
FIG. 1 is a schematic diagram of an output-weighted, charge-coupled-device transversal filter embodying the invention.

FIG. 1 shows a CCD delay line 5 using forward clocking at a rate $f_c$. The $\phi_1$-phase and DC gate electrodes are shown schematically as being constructed in a first polysilicon layer. The SIG1, $\phi_2$-phase, and $\phi_R$ gate electrodes are shown schematically as being constructed in a second polysilicon layer. The SIG2 and $\phi_3$-phase gate electrodes are shown schematically as being constructed in a third polysilicon layer. The charge transfer channel of CCD delay line 5 may be constructed as either a surface channel or a buried channel in the semiconductor substrate, the latter alternative generally being preferred to avoid problems owing to surface recombination. Three-phase clocking with successive clock phases $\phi_1$, $\phi_2$, $\phi_3$ is used by way of example in FIG. 1; and the reset pulse $\phi_R$ may be the equivalent of phase $\phi_2$. It will be assumed the charge transfer channel is n type in a p type substrate, for purposes of discussion.

CCD delay line 5 is provided with a source diffusion 10 pulsed at clock rate $f_c$ as part of a fill-and-spill input stage 6 at its input end; floating diffusions 11, 12, 13, 14 and 15 along its length; and a drain diffusion 16 at its output end. The charge transfer channel between each successive pair of the floating diffusions 11-15 is crossed by a succession of gate electrodes that operate to differentially delay the samples appearing in charge packet form under these floating diffusions. The gate electrodes of insulated-gate field effect transistors 21, 22, 23, 24 and 25 are ohmically contacted to the floating diffusions 11, 12, 13, 14 and 15 and are connected at their source and drain electrodes for operation as electrometers. The specific electrometer connections shown condition FET's 21-25 to operate as source-followers—i.e., common-drain amplifiers. These specific electrometer connections include ohmic contacts of the drain electrometers of FET's 21-25 and drain diffusion 16 to busses connecting to a source of operating potential $+V$. These specific electrometer connections also include connections of the source electrodes of FET's 21, 22, 23, 24 and 25 to substrate potential (shown as ground) through respective source load resistances 31, 32, 33, 34 and 35.

FET's 21-25 and their source-follower connections are assumed to be included on the same semiconductor substrate with tapped CCD delay line 5, as with customary floating-diffusion electrometer output stages for CCD's. The source-follower output connections of FET's 21, 22, 23, 24 and 25 are to respective input connections of off-substrate buffer amplifiers 41, 42, 43, 44 and 45, each of which provides a few times voltage amplification. Buffer amplifiers 41, 42, 43, 44 and 45 also can provide low source impedances for synchronous detectors 51, 52, 53, 54 and 55 which follow them in cascade.

Synchronous detectors 51-55 typically will include switching demodulators which switch in accordance with a pulse train $\phi_s$ that has a clock rate harmonically related to $f_c$. The clock rate of pulse train $\phi_s$ may be in first harmonic relationship to $f_c$, for example. The synchronous detectors 51-55 are of a type that provides substantially no response, comparatively, to lower frequencies in the baseband spectrum of the electrometer output signals that the source electrodes of electrometer FET's 11-15 respectively supply. For example, each of the synchronous detectors 51-55 may include switching demodulators that are of a form balanced against the baseband spectrum of input signals supplied synchronous detectors 51-55 from buffer amplifiers 41-45. Or, as another example, each of the synchronous detectors 51-55 may include a base-band suppression filter followed by an unbalanced switching demodulator. Or, as still another example, each of the synchronous detectors 51-55 may include a base-band suppression filter followed by a sample-and-hold circuit which samples in response to $\phi_s$ pulses.

The output responses of synchronous detectors 51, 52, 53, 54 and 55 are linearly combined in network 56 to generate the overall filter response to the filter input signal. The filter input signal is applied as pulse modulation superposed on one of the direct potentials applied to the gate electrodes 7 and 8 of fill-and-spill input stage 6. Each pulse of this pulse modulation overlaps the $f_c$ rate pulses applied to source diffusion 10 from pulse generator 20. In short, fill-and-spill input stage 6 is operated conventionally.

The linear combining network 56 may do weighting, followed by additive combining, as is the case in a low-pass transversal filter configuration, for example. Or, the linear combining network 56 may do weighting, followed by both additive and subtractive combining, as is the case in a band-pass transversal filter configuration, for example.

Three-phase clocking is shown by way of example in the FIG. 1 transversal filter. The short gate electrodes 61-65 directly follow the floating diffusions 11-15, and receive a direct voltage DC to provide electrostatic shielding of the floating diffusions from the $\phi_2$ clock phase signal applied to the gate electrodes 66-70. The long gate electrodes 71-75, receptive of direct voltage DC, provide barrier heights over which charge packets are forced by the $\phi_3$ clock phase going negative in voltage, to cause their respective charge contents to flow under floating diffusions 11-15 respectively. The first clocked electrodes 66-70 following floating diffusions 11-15 should be negative in voltage during this $\phi_3$ clock phase transition to keep the charge packets under the floating diffusions.

The synchronous detectors 51-55 do not respond to baseband components of charge level transitions, but only to charge level transitions further removed from zero frequency; thus lengthening electrometer sampling times does not increase filter response linearly. So the $\phi_2$ clock phase is appropriate for the $\phi_r$ reset pulses applied to reset gate electrode 76, and one need not provide bussing for especial $\phi_r$ pulses. Also, the $\phi_2$ clock phase is appropriate for application to the first clocked gate electrodes 66-69 following floating diffusions 61-64.

The direct voltage DC applied to gate electrodes 71-75 almost completely replaces $\phi_1$ in the FIG. 1 transversal filter, because the successive tap points are only one CCD charge transfer stage apart. Where the tap points are to be two charge transfer stages apart, each cascade of a $\phi_2$ gate electrode followed by a $\phi_3$ gate electrode could be replaced by the succession of $\phi_2$ gate electrode, $\phi_3$ gate electrode, $\phi_1$ gate electrode, $\phi_2$ gate electrode, and $\phi_3$ gate electrode. As the successive tap points are spaced apart by even more charge transfer stages, the regularly recurrent cycle of the $\phi_1$ gate electrode, $\phi_2$ gate electrode, and $\phi_3$ gate electrode will be even more in evidence.

Figure 2:
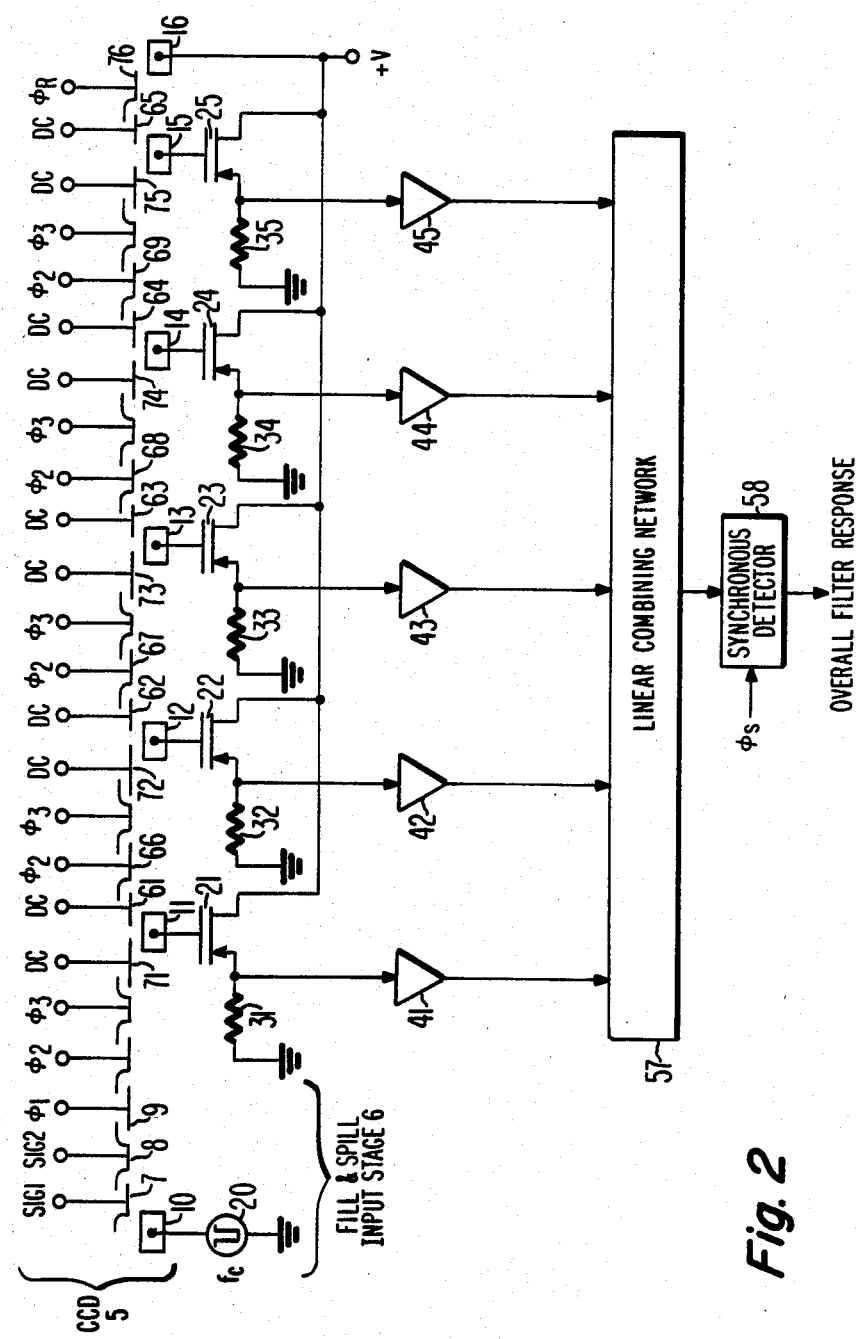
FIG. 2 is a schematic diagram of another output-weighted, CCD transversal filter embodying the invention.

FIG. 2 shows an alternative to the FIG. 1 CCD transversal filter in which the amplified electrometer responses respectively supplied by buffer amplifiers 41, 42, 43, 44 and 45 are linearly combined in a network 57 to supply input signal to a single synchronous detector 58. Synchronous detector 58 switches responsive to $\phi_s$ pulse train, supplied at a harmonic (e.g., the first harmonic) of $f_c$, to heterodyne one of the harmonic subspectra of linear combining network 57 to baseband, thereby to generate the overall filter response.

The FIG. 2 transversal filter avoids the problem of having to match synchronous detector conversion gains, and saves a number of synchronous detectors. But the FIG. 1 transversal filter has a greater amount of dynamic range, because of the parallelling of signal channels until the linear combining is done in the very last stage.

Interestingly, where both positive and negative filter weights are to be used, the polarity of the filter weights may be assigned by the synchronous detectors 51-55 in the FIG. 1 transversal filters. The synchronous detectors providing positive filter weights are switched by the $\phi_s$ pulse train, and those providing negative weights are switched by a pulse train phase-shifted from the $\phi_s$ pulse train.

FIG. 3 shows a variation that can be introduced into either of the FIG. 1 and FIG. 2 filters, with regard to any one of its floating-diffusion electrometers. Each floating diffusion 80 has a respective preceding gate electrode 81, which has clocking voltage $\phi_1'$ applied to it rather than a dc voltage. This clocking voltage is a reduced-amplitude or "shallower" clocking voltage than $\phi_1$, but is similarly phased.

FIGS. 4 and 5 show another variation that can be introduced into either of the FIG. 1 and FIG. 2 filters, with regard to any one of its floating-diffusion electrometers. Each floating diffusion 80 has a clocked split-gate electrode structure following it. This split-gate electrode structure consists of a short-length gate electrode 82 followed by a longer-length gate electrode 83. Gate electrode 82, while exhibiting the same clock voltage variations thereon as gate electrode 83, is made to induce a barrier potential in the portion of the charge transfer channel thereunder as compared to the portion of the charge transfer channel under gate electrode 83. This is done to avoid roll-back of charge onto floating diffusion 80 after transfer. In FIG. 4 this is shown as being done by placing gate electrode 82 closer to the semiconductor substrate than gate electrode 83. In FIG. 5 this is implemented by means 84 for introducing a direct bias potential offset between the gate electrodes 82 and 83, which means is schematically represented by a direct voltage source. One may alternatively arrange to place on gate electrode 82 a clocking voltage $\phi_2'$ of larger amplitude than $\phi_2$, swinging more positive to aid the transfer of charge from floating diffusion 80.

A number of other variants of these transversal filters will occur to one skilled in CCD filter design and acquainted with the foregoing disclosure. Uni-phase, two-phase or other multiphase clocking schemes may be used, instead of three-phase clocking, in other CCD filters embodying the invention.

Where linear-phase filtering is employed, linear combining of certain signals before weighting rather than after is possible, of course. A pair of filters as described in connection with FIG. 1 or 2 can be supplied with anti-phase input signals to generate positive-weighted and negative-weighted tap signals analogous to split-gate practice in CCD filters using floating-gate electrometers. Output filter weights may be assigned by scaling the dimensions of electrometer FETs where they are employed in common-source, rather than common-drain, amplifier connection.

Iterative CCD filters can use the non-destructive floating-diffusion electrometer disclosed in this specification to sense charge packets circulated in a looped CCD delay line. So can short-term CCD serial memory configurations using a looped CCD delay line. In such applications, the floating-gate electrometer may be selectively operated—either destructively, or non-destructively in accordance with the invention. This selective operation is simply provided by placing a reset gate and reset drain structure at the side of the looped CCD delay line, next to where the floating diffusion is located.

The non-destructive floating-diffusion electrometers of the invention can be used for sensing the levels of photogenerated charge in a charge transfer channel, as well as the levels of electrically injected charge. In such applications particularly, and in other applications where charge levels are low and there is no inherent bias charge, it is desirable to use fat-zero bias charges. This is done so charge transfer past the floating diffusion is complete enough to avoid lag in the harmonic spectra of the electrometer output signals being synchronously detected. Fill-and-spill input stages can inject such fat-zero bias at noise levels so low as to be masked by electrometer Johnson noise. Lag effects can also be suppressed in the synchronous detector output signals by arranging for the synchronous detector to sample electrometer output signal voltage only during time intervals when charge packets are transferred onto the floating diffusion. Synchronous detection at a harmonic of charge transfer clock rate is a differentiating process, only sensitive to change in charge level on the floating diffusion. The transfer of charge onto the floating diffusion is always substantially complete. The transfer of charge from the floating diffusion, being in the nature of a bucket brigade process, is less efficient particularly for lower amplitude charges. Suppressing synchronous detector response to the transfer of charge from the floating diffusion avoids the lag associated with the inefficient charge transfer. The transfer of charge from the floating diffusion being in the nature of a single bucket brigade stage transfer, the steps employed to improve the efficiency of such transfers generally will be helpful with regard to this invention.

What is claimed is:

1. In combination:
    a CCD delay line having input means for introducing charge packets into said delay line, a plurality of floating diffusion electrometer signal taps spaced from said input along said delay line for developing a corresponding plurality of delayed outputs, means clocking said charge packets along said delay line for generating potential responses at the floating diffusion of said electrometers; and
    means for detecting energy at the output of said electrometers that lies in a range of frequencies including at least one sideband of a harmonic of the charge packets clocking rate, but does not include at least the lower baseband frequencies.

2. A combination comprising:

a CCD clocked delay line having a charge transfer channel with a first succession of gate electrodes crossing thereover, a second succession of gate electrodes crossing thereover following said first succession of gate electrodes after a hiatus therebetween, and an end drain diffusion connected to receive a drain potential, the final one of the gate electrodes in said first succession being connected for receiving a barrier-inducing potential and others of said gate electrodes in said first and second successions being connected for receiving cyclically varying clocking voltages of a given clocking rate;

a floating diffusion in the charge transfer channel of said CCD clocked delay line under the hiatus between said first and second successions of gate electrodes;

a field effect transistor with a gate electrode connected to said floating diffusion and with source and drain electrodes connected for operating said field effect transistor as an electrometer, to supply an electrometer output signal responsive to charge packets clocked under said floating diffusion by the clocking voltages applied to said first and second successions of CCD clocked delay line gate electrodes; and means for detecting energy in said electrometer output signal that lies in a range of frequencies including at least one sideband of a harmonic of said given clocking rate, but does not include at least the lower baseband frequencies, to obtain an output signal for said combination.

3. A combination as set forth in claim 2 wherein the final one of the gate electrodes in said first succession is connected to receive a direct potential as said barrier-inducing potential.

4. A combination as set forth in claim 2 wherein the final one of the gate electrodes in said first succession is connected to receive a reduced amplitude clocking voltage as said barrier-inducing potential.

5. A combination as set forth in claim 2 further including:

a third succession of gate electrodes crossing over the charge transfer channel of said CCD clocked delay line, following said second succession of gate electrodes after a hiatus, ones of the gate electrodes in said third succession being connected for receiving said cyclically varying clocking voltages of the given clocking rate;

a further floating diffusion in the charge transfer channel of said CCD clocked delay line under the hiatus between said second and third successions of gate electrodes;

means for connecting the final gate electrode in said second succession to receive a barrier inducing potential;

a further field effect transistor, with a gate electrode connected to said further floating duffusion, and with source and drain electrodes connected for operating said further field effect transistor as an electrometer, to supply a further electrometer output signal; and means for detecting energy in said further electrometer output signal that lies in said range of frequencies, to obtain a further output signal for said combination.

6. A combination as set forth in claim 2 further including:

a further floating diffusion in the charge transfer channel of said CCD clocked delay line following said second succession of gate electrodes;

means for connecting the final gate electrode in said second succession to receive a barrier inducing potential;

a reset gate electrode crossing the charge transfer channel of said CCD clocked delay line following said further floating diffusion;

a reset drain electrode in the charge transfer channel of said CCD clocked delay line following said reset gate electrode;

a further field transistor, with a gate electrode connected to said further floating diffusion, and with source and drain electrodes connected for operating said further field effect transistor as an electrometer, to supply a further electrometer output signal;

means for applying a reset drain potential to said reset drain via an ohmic contact thereto;

means applying a reset pulse to said reset gate electrode, following each admission of a charge packet under said further floating diffusion, for draining said charge packet to said reset drain diffusion; and means for detecting energy in said further electrometer output signal that lies in said range of frequencies, to obtain a further output signal for said combination.

7. A charge-coupled-device transversal filter comprising:

a substrate of semiconductive material;

a charge transfer channel disposed in said substrate;

means for serially injecting charge packets into an input end of said charge transfer channel, the amplitudes of successive ones of said charge packets describing the amplitudes of respective successive samples of an input signal;

a plurality of floating diffusions, respectively ordinally numbered first through $n^{th}$, disposed in order of their ordinally numbering between the input end and the output end of said charge transfer channel;

a terminal drain diffusion, disposed in the output end of said charge transfer channel, ohmically contacted, and connected for receiving a drain potential;

a respective succession of gate electrodes for receiving clocking signals between each successive one of said diffusions in said charge transfer channel; and a plurality of field effect transistors, respectively ordinally numbered first through $n^{th}$, with each of their respective gate electrodes connected to the floating diffusion ordinally numbered like the field effect transistor, and with their respective source and drain electrodes connected for operating them as first through $n^{th}$ electrometers respectively, for generating first through $n^{th}$ electrometer output signals;

a plurality of synchronous detectors, n in number, ordinally numbered first through $n^{th}$, each detecting the electrometer output signal ordinally numbered like the synchronous detector, at a harmonic of said clock rate, for generating a respective synchronous detector output signal; and means for linearly combining said synchronous detector output signals, to generate the output signal of said charge-coupled-device filter.

8. A charge-coupled-device transversal filter comprising:
- a substrate of semiconductive material;
- a charge transfer channel disposed in said substrate;
- means for serially injecting charge packets into an input end of said charge transfer channel, the amplitudes of successive ones of said charge packets descriptive of the amplitudes of respective successive samples of an input signal;
- a plurality of floating diffusions, respectively ordinally numbered first through $n^{th}$, disposed in order of their ordinally numbering between the input end and the output end of said charge transfer channel;
- a terminal drain diffusion, disposed in the output end of said charge transfer channel, ohmically contacted, and connected for receiving a drain potential;
- a succession of gate electrodes for receiving clocking signals at similar clock rate between each successive one of said diffusions in said charge transfer channel;
- a plurality of field effect effect transistors, respectively ordinally numbered first through $n^{th}$, with their respective gate electrodes connected to the floating diffusion ordinally numbered like the field effect transistor via respective ohmic contacts, and with their respective source and drain electrodes connected for operating them as first through $n^{th}$ electrometers respectively, for generating first through $n^{th}$ electrometer output signals;
- means for linearly combining said first through $n^{th}$ electrometer output signals; and
- a synchronous detector detecting the linearly combined first through $n^{th}$ electrometer output signals at a harmonic of said clock rate, to generate the output signal of said charge-coupled-device filter.

* * * * *